(12) United States Patent
Fujiwara et al.

(10) Patent No.: US 9,607,836 B2
(45) Date of Patent: Mar. 28, 2017

(54) SEMICONDUCTOR DEVICE AND MANUFACTURING METHOD OF SEMICONDUCTOR DEVICE

(71) Applicants: Hirokazu Fujiwara, Miyoshi (JP); Narumasa Soejima, Seto (JP)

(72) Inventors: Hirokazu Fujiwara, Miyoshi (JP); Narumasa Soejima, Seto (JP)

(73) Assignee: TOYOTA JIDOSHA KABUSHIKI KAISHA, Toyota-Shi (JP)

( * ) Notice: Subject to any disclaimer, the term of this patent is extended or adjusted under 35 U.S.C. 154(b) by 27 days.

(21) Appl. No.: 14/417,902

(22) PCT Filed: Sep. 24, 2013

(86) PCT No.: PCT/IB2013/002112
§ 371 (c)(1),
(2) Date: Jan. 28, 2015

(87) PCT Pub. No.: WO2014/060804
PCT Pub. Date: Apr. 24, 2014

(65) Prior Publication Data
US 2015/0214052 A1    Jul. 30, 2015

(30) Foreign Application Priority Data
Oct. 19, 2012    (JP) .................... 2012-231547

(51) Int. Cl.
*H01L 21/04*    (2006.01)
*H01L 21/306*   (2006.01)
*H01L 21/3213*  (2006.01)

(52) U.S. Cl.
CPC .... *H01L 21/0485* (2013.01); *H01L 21/30604* (2013.01); *H01L 21/32133* (2013.01)

(58) Field of Classification Search
CPC .................................................. H01L 21/0485
USPC .......................................................... 438/602
See application file for complete search history.

(56) References Cited

U.S. PATENT DOCUMENTS

| 6,759,683 B1 | 7/2004 | Cole et al. |
| 2006/0267128 A1 | 11/2006 | Kawami |
| 2011/0198617 A1* | 8/2011 | Iwanaga ............. H01L 21/0485 257/77 |

(Continued)

FOREIGN PATENT DOCUMENTS

| DE | 102007029829 A1 | 1/2009 |
| JP | 2002-093742 A | 3/2002 |

(Continued)

*Primary Examiner* — Fernando L Toledo
*Assistant Examiner* — Valerie N Newton
(74) *Attorney, Agent, or Firm* — Andrews Kurth Kenyon LLP

(57) ABSTRACT

A manufacturing method of a semiconductor device includes: forming an electric metal layer by depositing metal as art electrode material on an inside of an opening of an insulating layer on a surface of an SiC semiconductor substrate; widening a gap between an inner wall surface in an opening formed in the insulating layer and the electrode metal layer by etching the insulating layer after the electrode metal layer is formed; and forming an ohmic contact between the electrode metal layer and the SiC semiconductor substrate by heating the SiC semiconductor substrate and the metal electrode layer after the insulating layer is etched.

3 Claims, 5 Drawing Sheets

(56) References Cited

U.S. PATENT DOCUMENTS

2012/0228630 A1  9/2012 Shimizu et al.

FOREIGN PATENT DOCUMENTS

| JP | 2006332230 A | 12/2006 |
| JP | 2008227405 A | 9/2008 |
| JP | 2011-176183 A | 9/2011 |
| JP | 2011204804 A | 10/2011 |
| JP | 2012186324 A | 9/2012 |

* cited by examiner

SEMICONDUCTOR DEVICE AND MANUFACTURING METHOD OF SEMICONDUCTOR DEVICE

CROSS-REFERENCE TO RELATED APPLICATIONS

This is a national phase application based on the PCT International Patent Application No. PCT/IB2013/002112 filed Sep. 24, 2013, claiming priority to Japanese Patent Application No. 2012-231547 filed Oct. 19, 2012, the entire contents of both of which are incorporated herein by reference.

BACKGROUND OF THE INVENTION

1. Field of the Invention

The present invention relates to a semiconductor device and a manufacturing method of a semiconductor device.

2. Description of Related Art

A technology has been developed in which a portion of an insulating layer formed on a surface of an silicon carbide (SiC) semiconductor substrate is removed by etching to form an opening and a metal electrode which forms an ohmic contact with the SiC semiconductor substrate is formed in the opening. In a manufacturing method of a semiconductor device disclosed in Japanese Patent Application Publication No. 2011-176183 (JP 2011-176183 A), a silicon oxide film ($SiO_2$ film) is first formed on the surface of the SiC semiconductor substrate. A resist layer is next formed on a surface of the silicon oxide film. Then, an opening is formed by patterning the resist layer. The silicon oxide film in an area exposed through the opening of the resist layer is next etched. The resist layer is then removed, and a metal (molybdenum) electrode layer is formed on the silicon oxide film and the surface of the SiC semiconductor layer. A resist layer is next formed on a surface of the metal electrode layer. The resist layer is then patterned, thereby forming a resist layer only on a portion to remain as an electrode. The metal electrode layer is next removed by etching, thereby allowing only the metal electrode layer protected by the resist layer to remain. Accordingly, the metal electrode is formed in the opening of the insulating layer.

In the manufacturing method described in JP 2011-176183 A, the metal electrode is formed in a whole area where the silicon oxide film ($SiO_2$ film) is removed on the SiC semiconductor substrate. In other words, sintering is performed in a state where the metal electrode and the silicon oxide film contact with each other. As a result, metal oxides may be generated in a reaction between the metal electrode and the silicon oxide film $SiO_2$. This may increase a contact resistance between the SiC semiconductor substrate and the metal electrode.

SUMMARY OF THE INVENTION

The present invention provides a technology which can hinder an increase in contact resistance between an SiC substrate and an electrode metal layer.

A manufacturing method of a semiconductor device, the method includes: forming an insulating layer on a surface of an SiC semiconductor substrate; forming a resist layer having an opening on a surface of the insulating layer; removing the insulating layer in an area exposed through the opening of the resist layer; forming an electrode metal layer by depositing metal as an electrode material on the surface of the SiC semiconductor substrate and a surface of the resist layer in a state where the resist layer is formed on the insulating layer after the insulating layer is removed; removing the resist layer on which the electrode metal layer is deposited after the electrode metal layer is formed; widening a gap between an inner wall surface of an opening formed in the insulating layer and the electrode metal layer by etching after the resist layer is removed; and forming an ohmic contact between the electrode metal layer and the SiC semiconductor substrate by heating the SiC semiconductor substrate and the electrode metal layer after the etching is performed.

According to an above aspect, sintering is performed after the gap between the electrode metal layer and the insulating layer is widened. As a result, an increase in contact resistance between the SiC substrate and the electrode metal layer is hindered.

A semiconductor device in accordance with a second aspect of the present invention includes: an SiC semiconductor substrate; an insulating layer arranged on a surface of the SiC semiconductor substrate and having an opening for exposing a portion of the surface of the SiC semiconductor substrate; an ohmic electrode layer arranged in the opening of the insulating layer and forming an ohmic contact with the surface of the SiC semiconductor substrate; a carbon adsorbing metal layer arranged on a surface of the ohmic electrode layer in the opening of the insulating layer; and a protective metal layer arranged on a surface of the carbon adsorbing metal layer, the surface of the ohmic electrode layer, side surfaces of the carbon adsorbing metal layer in the opening of the insulating layer.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Figure 1:
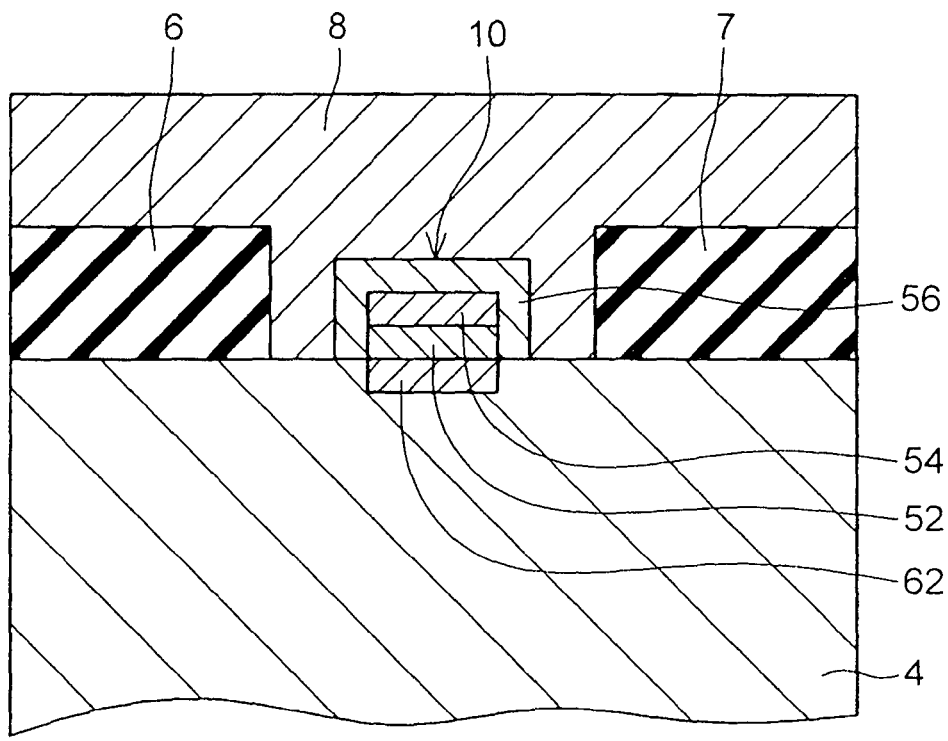
FIG. 1 is an enlarged cross-sectional view for schematically showing peripheral portions of a semiconductor device of an embodiment of the present invention.
Figure 2:
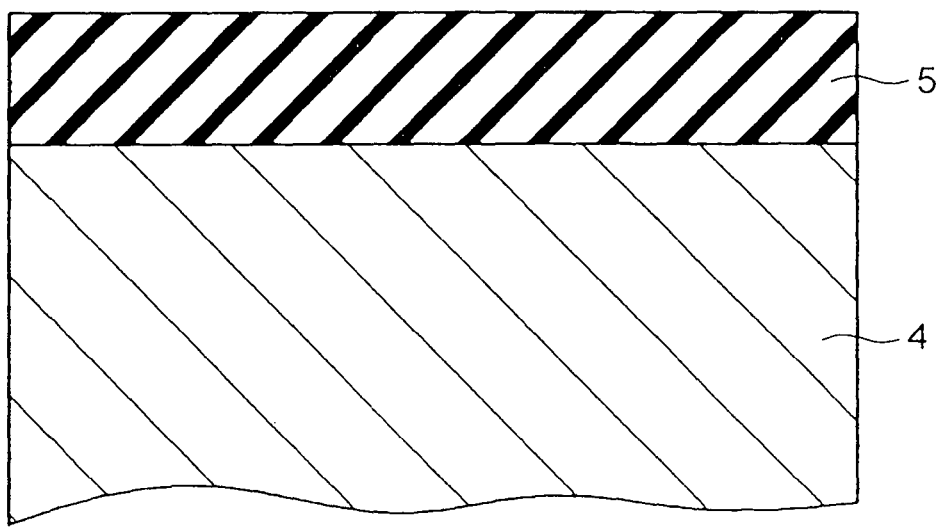
FIG. 2 is an enlarged cross-sectional view for explaining a manufacturing method of the peripheral portions of the semiconductor device of the embodiment of the present invention.

In the manufacturing method of a semiconductor device disclosed in the present invention, a step of forming an electrode metal layer may include a step of forming an ohmic electrode layer by depositing a metal material which forms an ohmic contact with an SiC semiconductor substrate on a surface of the SiC semiconductor substrate and a surface of a resist layer. The step of forming the electrode metal layer may include a step of forming a protective metal layer by depositing a metal material which protects the ohmic electrode layer on a face side of the ohmic electrode layer after the ohmic electrode layer is formed.

In the above manufacturing method of a semiconductor device, a step of etching is performed in a state where the protective metal layer is formed on the ohmic electrode layer. This hinders a surface (upper surface) of the ohmic electrode layer from being etched, thereby hindering excessive reduction in the dimension of the ohmic electrode layer. As a result, an increase in contact resistance between the ohmic electrode layer and the SiC semiconductor substrate can be hindered.

In the step of etching in the manufacturing method of a semiconductor disclosed in the present invention, while the side walls of the ohmic electrode layer is further etched, the protective metal layer may not be etched. Further, sintering may be performed at a temperature not lower than a melting point of the protective metal layer.

In the manufacturing method of a semiconductor device, side surfaces of the ohmic electrode layer positioned below the protective metal layer are removed like those are scooped, and the protective metal layer laterally protrudes with respect to the ohmic electrode layer. Because the sintering is performed at a temperature higher than the melting point of the protective metal layer in such a state, the protective metal layer melts and covers the ohmic electrode layer. This further hinders contact between the ohmic electrode and an insulating layer. Accordingly, generation of metal oxides on the ohmic electrode layer is further hindered, thereby hindering an increase in contact resistance. In the present invention, "not being etched" does not mean not being etched at all but includes a case where when a plurality of layers are etched, one is hardly etched compared to another due to difference in etching rate.

In the manufacturing method of a semiconductor device disclosed in the present invention, the etching may be wet etching which uses an etching solution. An etching rate of the etching solution for the protective metal layer may be lower than an etching rate of the etching solution for the insulating layer and lower than the etching rate of the etching solution for the ohmic electrode layer.

In the above manufacturing method of a semiconductor device, the etching rates of the etching solution for the insulating layer, the ohmic electrode layer, and the protective metal layer are adjusted, thereby enabling the etching step by wet etching that is a simple method.

In the manufacturing method of a semiconductor device disclosed in the present invention, the step of forming the electrode metal layer may further include a step of forming a carbon adsorbing metal layer by depositing a metal material which adsorbs carbon on a surface of the ohmic electrode layer between the step of forming the ohmic electrode layer and the step of forming the protective metal layer.

In the above manufacturing method of a semiconductor device, the carbon adsorbing metal layer is formed between the ohmic electrode layer and the protective metal layer. The carbon adsorbing metal layer can adsorb byproduct carbon (C) generated in a reaction between the ohmic electrode layer and silicon in the insulating layer. As a result, an increase in contact resistance between the SiC semiconductor substrate and the ohmic electrode layer due to deposition of carbon on a contact interface between the SiC semiconductor substrate and the ohmic electrode layer can be hindered.

The semiconductor device disclosed in the present invention includes: an SiC semiconductor substrate; an insulating layer arranged on a surface of the SiC semiconductor substrate and having an opening for exposing a portion of the surface of the SiC semiconductor substrate; an ohmic electrode layer arranged in the opening of the insulating layer and forming an ohmic contact with the surface of the SiC semiconductor substrate; a carbon adsorbing metal layer arranged on a surface of the ohmic electrode layer in the opening of the insulating layer; and a protective metal layer arranged on a surface of the carbon adsorbing metal layer, the surface of the ohmic electrode layer, side surfaces of the carbon adsorbing metal layer in the opening of the insulating layer.

In the semiconductor device, the carbon adsorbing metal layer adsorbs carbon (C), and the protective metal layer prevents the ohmic electrode metal layer from contacting with the insulating layer. As a result, an ohmic electrode having low contact resistance is realized.

Figure 9:
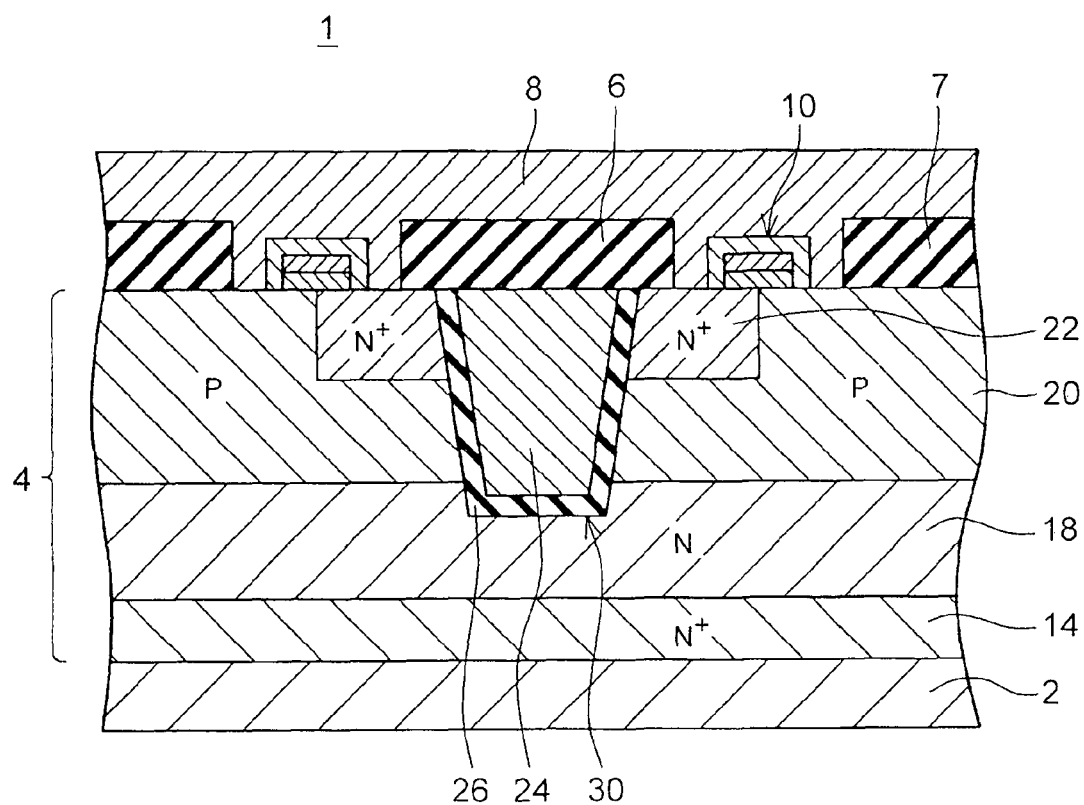
FIG. 9 is a cross-sectional view for showing a general configuration of the semiconductor device of the embodiment of the present invention.

A semiconductor device 1 manufactured by a manufacturing method of a semiconductor device of this embodiment will first be described. As shown in FIG. 9, the semiconductor device 1 is a vertical MOSFET. The semiconductor device 1 includes a drain electrode 2, an SiC semiconductor substrate 4, insulating layers 6, 7, a source electrode 10, and an, aluminum vapor deposition layer 8. The drain electrode 2 is formed of aluminum or the like. A drain electrode 2 forms an ohmic contact with a lower surface of the SiC semiconductor substrate 4.

The SiC semiconductor substrate 4 is formed of silicon carbide (SiC) as a material. A drain region 14 containing $N^+$ type impurity is formed in a lowermost layer (a layer above the drain electrode 2) of the SiC semiconductor substrate 4. A drift region 18 containing N type impurity is formed on the drain region 14. A base region 20 containing P type impurity is formed on the drift region 18. A source region 22 containing $N^+$ type impurity is selectively formed in the base region 20.

A trench 30 (groove) is formed in an upper surface of the SiC semiconductor substrate 4. The trench 30 passes through the source region 22 and the base region 20. The trench 30 has a lower end that reaches the drift region 18 and is formed in such a depth that does not reach the drain region 14. A gate insulating film 26 formed of silicon oxide is formed on an inner wall of the trench 30. A gate electrode 24 is embedded inside the gate insulating film 26. Polysilicon is used for the gate electrode 24, for example. The gate electrode 24 is opposed to the source region 22, the base region 20, and the drift region 18 via the gate insulating film 26.

A cap insulating layer 6 is formed on the upper surface of the SiC semiconductor substrate 4. The cap insulating layer 6 covers an upper surface of the gate electrode 24. The cap insulating layer 6 insulates the gate electrode 24 from the aluminum vapor deposition layer 8. An interlayer insulating layer 7 is further formed on the surface of the SiC semiconductor substrate 4. A gap is provided between the interlayer insulating layer 7 and the cap insulating layer 6, and a source electrode 10 is formed therebetween. The source electrode 10 is formed on both sides between which the cap insulating layer 6 is interposed. The aluminum vapor deposition layer 8 is formed in an uppermost layer of the SiC semiconductor substrate 4 to cover the cap insulating layer 6, the interlayer insulating layer 7, and the gate electrode 24.

Peripheral configurations of the source electrode 10 will next be described. As shown in FIG. 1, the source electrode 10 is formed between the cap insulating layer 6 and the interlayer insulating layer 7. The source electrode 10 includes an ohmic electrode layer 52, a carbon adsorbing metal layer 54, and a protective metal layer 56. The carbon adsorbing metal layer 54 is formed on the ohmic electrode layer 52. The protective metal layer 56 is formed on an upper surface and side surfaces of the carbon adsorbing metal layer 54 and side surfaces of the ohmic electrode layer 52. The ohmic electrode layer 52 is a layer in a lowermost position of the source electrode 10 (a layer positioned above the SiC semiconductor substrate 4). The ohmic electrode layer 52 forms an ohmic contact with the SiC semiconductor substrate 4. Specifically, a silicide layer 62 is formed in an interface between the ohmic electrode layer 52 and the SiC semiconductor substrate 4. At least one kind of metal selected from the group consisting of nickel (Ni), titanium (Ti), and aluminum (Al) may be used for the ohmic electrode layer 52, for example. In this embodiment, nickel (Ni) is used. At least one kind of metal selected from the group consisting of iron (Fe), tungsten (W), and titanium (Ti) may be used for the carbon adsorbing metal layer 54, for example. In this embodiment, iron (Fe) is used. At least one kind of metal selected from the group consisting of gold (Au), silver (Ag), and platinum (Pt) may be used for the protective metal layer 56, for example. In this embodiment, gold (Au) is used. The protective metal layer 56 is formed to cover an upper side and side surfaces of a metal layer in which the ohmic electrode layer 52 and the carbon adsorbing metal layer 54 are stacked. Gaps are formed between the protective metal layer 56 and the cap insulating layer 6 and between the protective metal layer 56 and the interlayer insulating layer 7.

A manufacturing method of the semiconductor device 1 of this embodiment will be described hereinafter. A conventional method can be used except a manufacturing method of the source electrode 10, and descriptions will thus be omitted. Here, a manufacturing method of peripheral portions of the source electrode 10 will be described. The source electrode 10 is formed after the drain region 14, the drift region 18, the base region 20, the source region 22, the gate electrode 24, and the like are formed in the SiC semiconductor substrate 4 and in peripheral portions thereof. However, those regions are not shown in FIGS. 1 to 8.

(Insulating Layer Formation Step)

Figure 3:
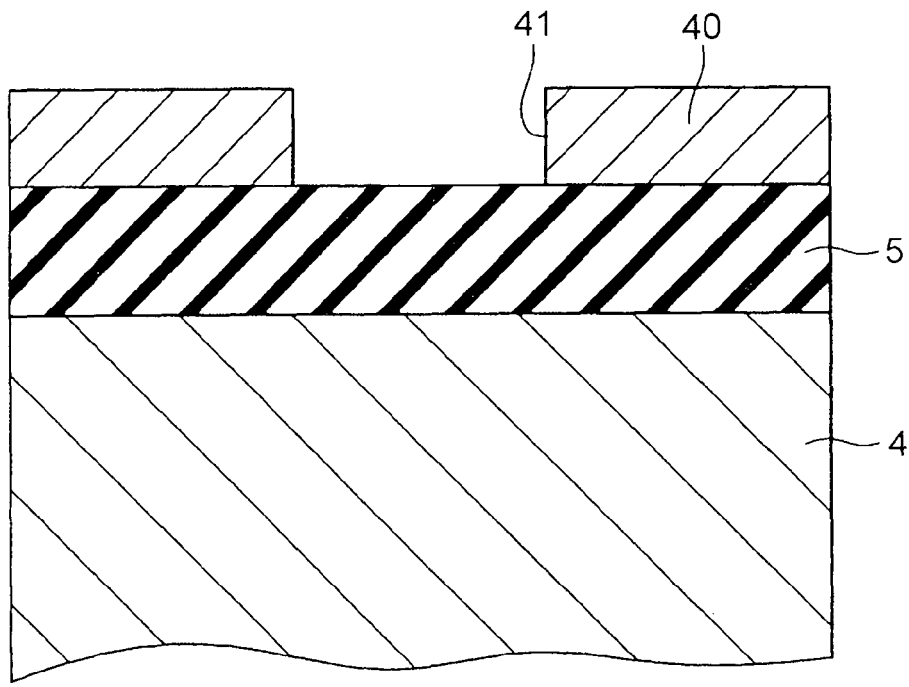
FIG. 3 is an enlarged cross-sectional view for explaining the manufacturing method of the peripheral portions of the semiconductor device of the embodiment of the present invention.

The insulating layer 5 formed of silicon oxide ($SiO_2$) is first formed on the surface of the SiC semiconductor substrate 4. The insulating layer 5 can be formed by a known method (for example, CVD or the like). The thickness of the insulating layer 5 may be set to 1.5 μm, for example. Next, a resist layer is formed on a whole surface of the insulating layer 5 by spin coating or the like, and the resist layer is patterned, thereby forming a resist mask 40 (FIG. 3). As shown in FIG. 3, the resist mask 40 has an opening 41 corresponding to the size of the formed gate electrode 24.

(Insulating Layer Removal Step)

Figure 4:
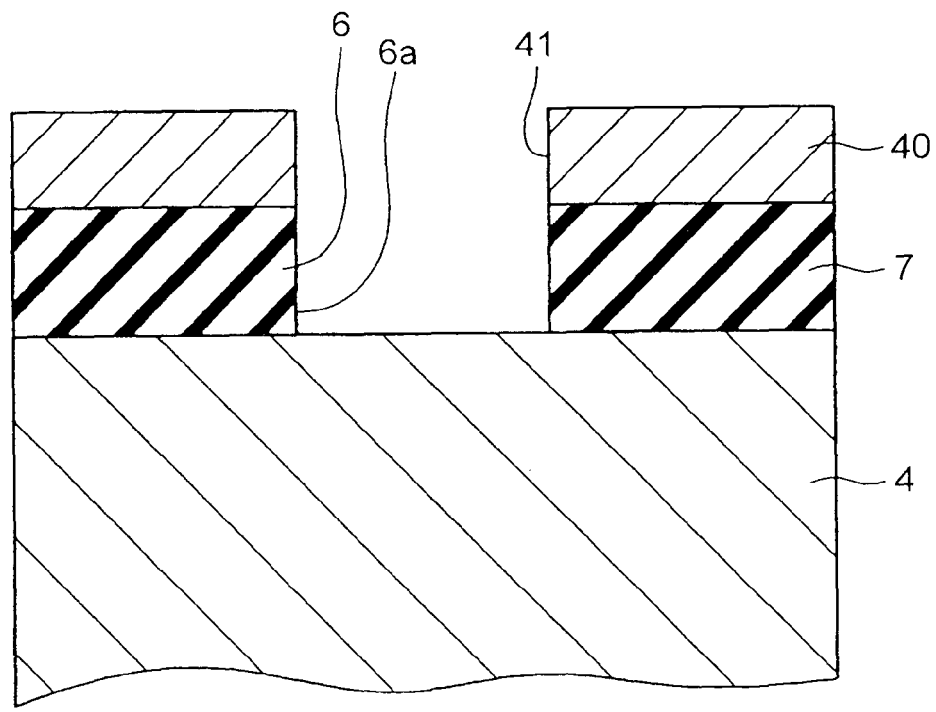
FIG. 4 is an enlarged cross-sectional view for explaining the manufacturing method of the peripheral portions of the semiconductor device of the embodiment of the present invention.

As shown in FIG. 4, the insulating layer 5 in an area exposed through an opening 41 of the resist mask 40 is next removed by dry etching. The insulating layer 5 positioned in the opening 41 of the resist mask 40 is removed, thereby exposing the SiC semiconductor substrate 4 inside the opening 41. The width of the opening 41 in the transverse direction of the figure may be set to two μM, for example. As shown in FIG. 4, a portion of the insulating layer 5 is removed, and the cap insulating layer 6, and the interlayer insulating layer 7 are thereby formed.

(Electrode Metal Layer Formation Step and Ohmic Electrode Layer Formation Step)

Figure 5:
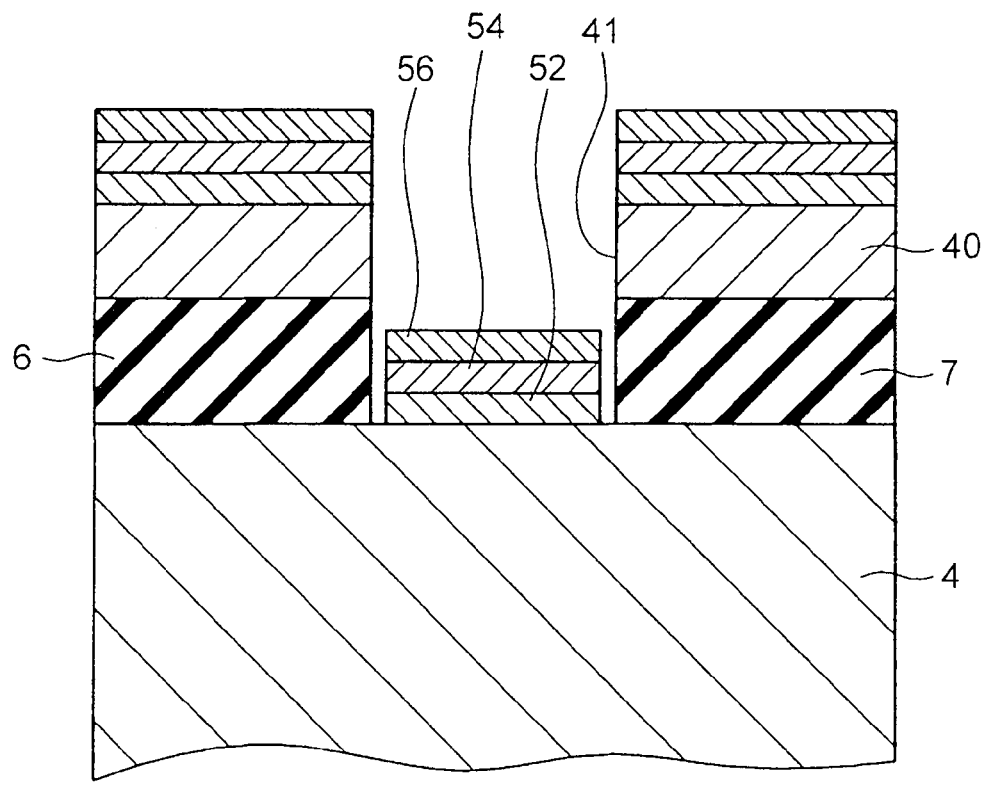
FIG. 5 is an enlarged cross-sectional view for explaining the manufacturing method of the peripheral portions of the semiconductor device of the embodiment of the present invention.

Next, in a state where the resist mask 40 remains on the cap insulating layer 6 and the interlayer insulating layer 7, nickel is deposited on the surface of the SiC semiconductor substrate 4 and a surface of the resist mask 40 by sputtering, thereby forming an Ni layer 52 (FIG. 5). The Ni layer 52 is the ohmic electrode layer 52 which forms, an ohmic contact with the SiC semiconductor substrate 4 by sintering, as described below. The thickness of the Ni layer 52 may be set to 50 nm, for example.

(Carbon Adsorbing Metal Layer Formation Step)

Next, iron is deposited on a surface of the Ni layer 52 by sputtering to form an Fe layer 54 (FIG. 5). As shown in FIG. 5, the Fe layer 54 is formed on a whole surface of the Ni layer 52. Therefore, the Fe layer 54 is formed above the resist mask 40. The Fe layer 54 becomes austenite by the sintering described below and serves as a carbon adsorbing layer which adsorbs carbon (C). The thickness of the Fe layer 54 may be set to 50 nm, for example.

(Protective Metal Layer Formation Step)

Next, gold is deposited on a surface of the Fe layer 54 to form an Au layer 56 (FIG. 5). The Au layer 56 is formed on a whole surface of the Fe layer 54 and above the resist mask 40. The Au layer 56 is a protective metal layer which protects the Ni layer 52 and the Fe layer 54 in a side etching step described below. The thickness of the Au layer 56 may be set to 50 nm, for example.

(Lift-Off Step)

Figure 6:
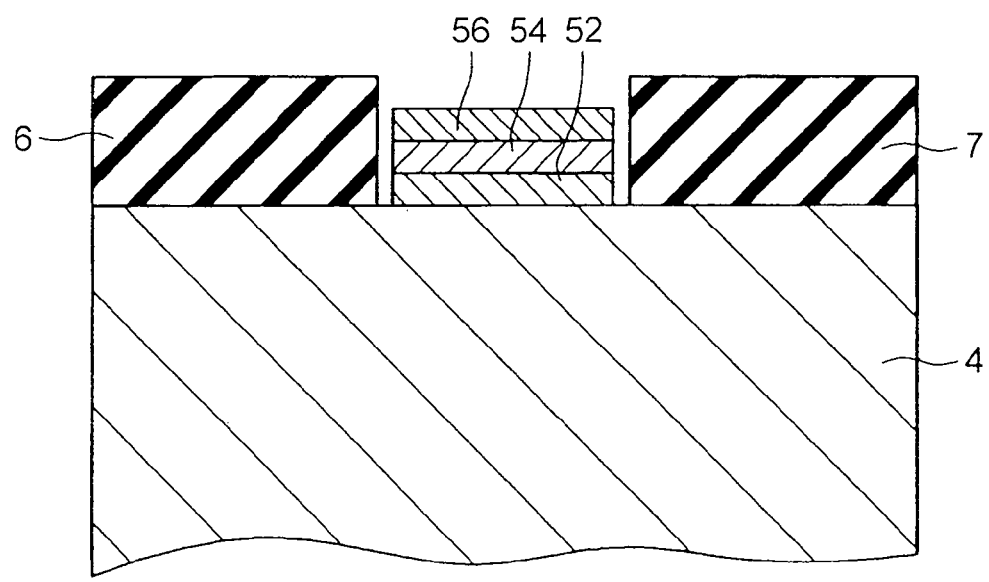
FIG. 6 is an enlarged cross-sectional view for explaining the manufacturing method of the peripheral portions of the semiconductor device of the embodiment of the present invention.

The resist mask 40 is next removed by use of an organic peeling agent (FIG. 6). At this point, the Ni layer 52, the Fe layer 54, and the Au layer 56 that are vapor-deposited on the surface of the resist mask 40 are also removed. Accordingly, a metal layer in which the Ni layer 52, the Fe layer 54, and the Au layer 56 are stacked is formed in an area inside the opening 41 of the surface of the SiC semiconductor substrate 4.

(Etching Step)

Figure 7:
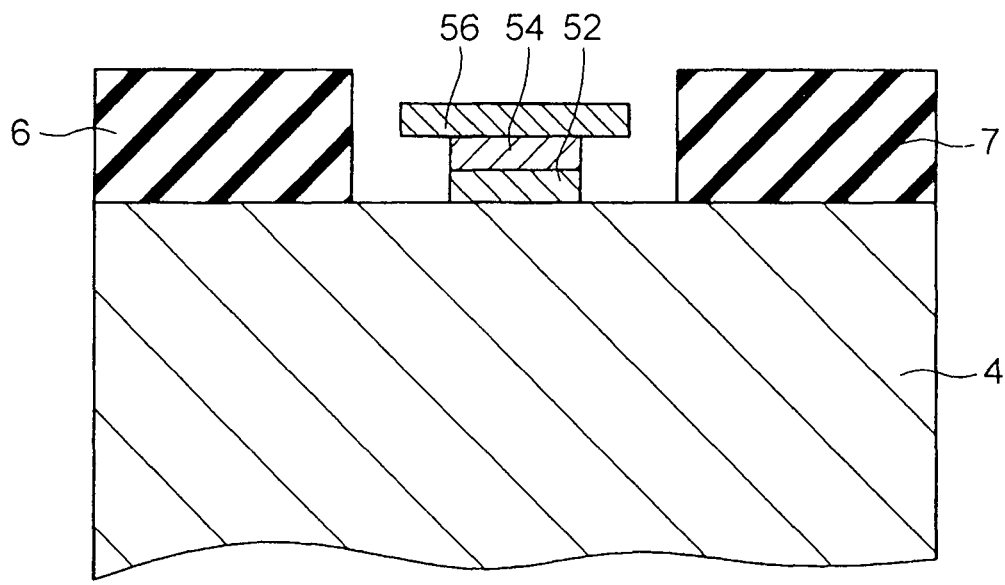
FIG. 7 is an enlarged cross-sectional view for explaining the manufacturing method of the peripheral portions of the semiconductor device of the embodiment of the present invention.

Wet etching is next performed on the SiC semiconductor substrate 4 from which the resist mask 40 is removed. Dilute hydrofluoric acid (DHF) can be used as an etching solution for wet etching, for example. The etching rates of the etching solution are high in the insulating layers 6, 7, the Ni layer 52, and the Fe layer 54 and low in the Au layer 56. Therefore, as shown in FIG. 7, upper surfaces and side surfaces, which are in the opening 41, of the insulating layers 6, 7 are removed by the wet etching. The side surfaces of the insulating layers 6, 7 are removed, thereby increasing the width of the opening 41 (the gap between the insulating layer 6 and the insulating layer 7). Further, because the etching rate for the Au layer 56 is low, the shape of the Au layer 56 hardly changes. Meanwhile, because the etching rates for the Ni layer 52 and the Fe layer 54 are high, side surfaces of the Ni layer 52 and the Fe layer 54 that contact with the etching solution are removed. Accordingly, as shown in FIG. 7, the Au layer 56 laterally protrudes with respect to the Ni layer 52 and the Fe layer 54. In order to obtain an effect described below for hindering an increase in contact resistance, the lengths of the etched side surfaces of the Ni layer 52 and the Fe layer 54 are preferably approximately 1.5 times (150 nm) of the sum of the thickness of the Ni layer 52 and the Fe layer 54.

(Sintering Step)

Figure 8:
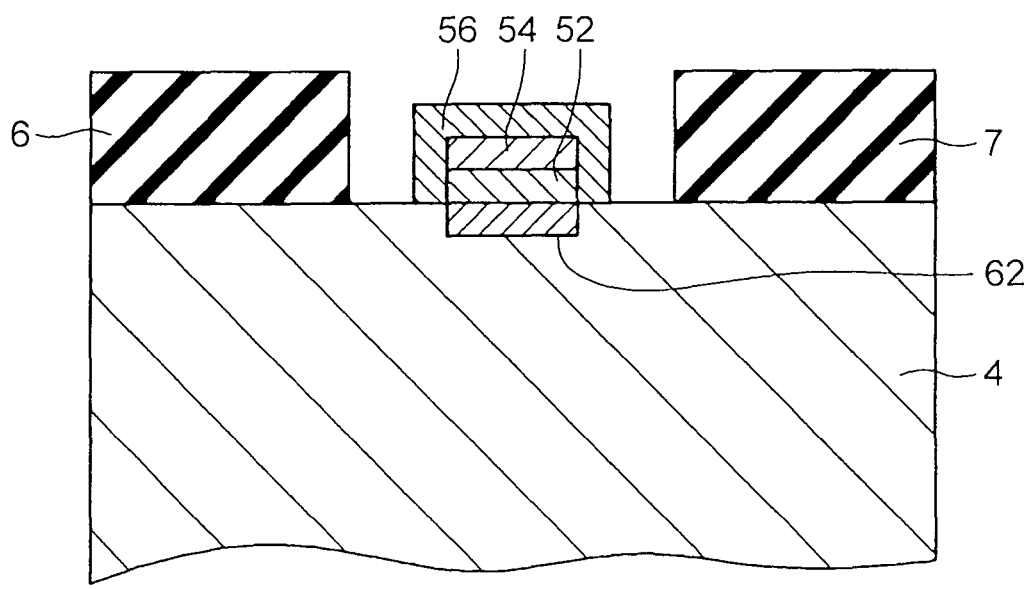
FIG. 8 is an enlarged cross-sectional view for explaining the manufacturing method of the peripheral portions of the semiconductor device of the embodiment of the present invention.

Sintering is next performed in which the SiC semiconductor substrate 4 is heated by a heating device (FIG. 8). An infrared lamp RTA (Rapid Thermal Anneal) device (not shown) can be used as the heating device, for example. The heating device may be of an open-atmosphere type. Here, the sintering is performed in a temperature range which is not lower than the melting point (1065° C.) of the Au layer 56 and where the Fe layer 54 becomes austenite. A heating period is one minute, for example. As shown in FIG. 8, the sintering allows the Ni layer 52 to react with the SiC semiconductor substrate 4, thereby forming nickel silicide 62 ($Ni_2Si$). The nickel silicide 62 reduces the contact resistance between the Ni layer 52 and the SiC semiconductor substrate 4, thereby forming the ohmic contact between the Ni layer 52 and the SiC semiconductor substrate 4.

Further, the Au layer 56 which laterally protrudes with respect to the Ni layer 52 and the Fe layer 54 melts by the sintering. Accordingly, as shown in FIG. 8, the melted Au layer 56 covers the side surfaces of the Ni layer 52 and the Fe layer 54. After the Au layer 56 melts, gaps are formed between the Au layer 56 and the cap insulating layer 6 and between the Au layer 56 and the interlayer insulating layer 7.

The aluminum vapor deposition layer 8 is finally formed to cover the gate electrode 24, the cap insulating layer 6, and the interlayer insulating layer 7. The aluminum vapor deposition layer 8 is formed by vapor-depositing titanium (Ti) in a thickness of 500 nm by sputtering and vapor-depositing aluminum (Al) in a thickness of four μm thereon. The state of FIG. 1 is obtained when the aluminum vapor-deposition layer 8 is formed.

In the above manufacturing method of the semiconductor device 1, the sintering is performed in a state where gaps are formed between the Ni layer 52 and the insulating layers ($SiO_2$) 6, 7. In other words, because the Ni layer 52 does not contact with the insulating layer 6 or the insulating layer 7 during the sintering, generation of metal oxides (for example, nickel oxide (NiO)) is hindered. As a result, an increase in contact resistance between the Ni layer 52 and the SiC semiconductor substrate 4 can be hindered.

Further, in the above manufacturing method of the semiconductor device 1, the Au layer 56 covers an upper surface of the Fe layer 54. Accordingly, in the side etching step, the Ni layer 52 is removed from their lateral sides. In other words, etching of the Ni layer 52 from its upper surface is hindered. This hinders excessive etching of the Ni layer 52. As a result, an increase in contact resistance between the Ni layer 52 and the SiC semiconductor substrate 4 can be hindered.

In the above manufacturing method of the semiconductor device 1, both of the Ni layer 52 and the Fe layer 54 that are positioned below the Au layer 56 are removed like their lateral sides are scooped. Accordingly, ends of the Au layer 56 laterally protrude with respect to the side surfaces of both of the Ni layer 52 and the Fe layer 54. The Au layer melts by the sintering step, thereby covering the side surfaces of both of the Ni layer 52 and the Fe layer 54. In other words, the Au layer 56 covers surfaces of portions of the Ni layer 52 and the Fe layer 54 that are exposed on the SiC semiconductor substrate 4. Accordingly, the Ni layer 52 contacts with the insulating layers ($SiO_2$) 6, 7 to generate metal oxides (for example, NiO), and an increase in contact resistance can thereby be hindered.

Further, the Au layer 56 covers the surfaces of the portions of the Ni layer 52 and the Fe layer 54 that are exposed on the SiC semiconductor substrate 4. This hinders the Ni layer 52 and the Fe layer 54 from being oxidized during the sintering. Accordingly, the sintering can be performed in an environment where oxygen is present. Therefore, a sintering device is not required to include an expensive vacuum mechanism, thereby reducing device cost. In addition, it is not required to perform purge for creating a vacuum in the sintering device, thereby allowing reduction in time required for the sintering.

Further, when the sintering at a high temperature is performed in a state where the SiC semiconductor substrate 4 contacts with the Ni layer 52, the Ni layer 52 reacts with silicon (Si) in the SiC semiconductor substrate 4, resulting in formation of nickel silicides (for example, $Ni_2Si$). The Ni layer 52 reacts with silicon (Si) in the SiC semiconductor substrate 4, thus generating carbon (C) as a byproduct from the SiC semiconductor substrate 4. When the byproduct carbon segregates to an interface or the like between the Ni layer 52 and the SiC semiconductor substrate 4, a byproduct layer is formed. The byproduct layer may increase the contact resistance between the SiC semiconductor substrate 4 and the Ni layer 52.

In the semiconductor device 1 of this embodiment, the source electrode 10 includes the Fe layer 54. The Fe layer 54 has austenite or martensite in at least a portion thereof. Accordingly, the byproduct carbon generated from the SiC semiconductor substrate 4 can be dissolved in the Fe layer 54. Therefore, an increase in contact resistance between the SiC semiconductor substrate 4 and the Ni layer 52 due to deposition of carbon on the contact interface between the SiC semiconductor substrate 4 and the Ni layer 52 can be hindered.

In the above embodiment, the Ni layer 52 is used as the ohmic electrode layer 52. However, titanium (Ti) or aluminum (Al) may be used as a material of the ohmic electrode layer 52.

Further, in the above embodiment, the protective metal layer 56 is formed of Au, but the present invention is not limited thereto. The protective metal layer 56 may be formed of silver (Ag) or platinum (Pt). In such a case, it is sufficient that the temperature of the sintering be not less than the melting point of silver (960° C.) or the melting point of platinum (1770° C.).

Further, in the above embodiment, the carbon adsorbing metal layer 54 is formed of Fe, but the present invention is not limited thereto. The carbon adsorbing metal layer 54 may be formed of tungsten (W) or titanium (Ti).

In the foregoing, specific examples of the present invention have been described in detail. However, those are only examples and do not limit the claims. Technologies recited in the claims include modifications and variations of the specific examples exemplified above. Further, technical elements described in the present invention and the drawings provide technical usefulness by themselves or in various combinations. Moreover, the technologies exemplified in the present invention or the drawings can simultaneously achieve a plurality of objects, and achievement of a single object among those provides technical usefulness.

The invention claimed is:

1. A manufacturing method of a semiconductor device, the method comprising:
    forming an insulating layer on a surface of a silicon carbide semiconductor substrate;
    forming a resist layer having an opening on a surface of the insulating layer;
    removing the insulating layer in an area exposed through the opening of the resist layer;
    forming an electrode metal layer by depositing metal as an electrode material on the surface of the SiC semiconductor substrate and a surface of the resist layer in a state where the resist layer is formed on the insulating layer after the insulating layer is removed;
    removing the resist layer on which the electrode metal layer is deposited after the electrode metal layer is formed;
    widening a gap between an inner wall surface of an opening formed in the insulating layer and the electrode metal layer by etching after the resist layer is removed; and
    forming an ohmic contact between the electrode metal layer and the SiC semiconductor substrate by heating the SiC semiconductor substrate and the electrode metal layer after the etching is performed, wherein
    the forming the electrode metal layer includes:
    forming an ohmic electrode layer by depositing a metal material which forms an ohmic contact with the SiC semiconductor substrate on the surface of the SiC semiconductor substrate and the surface of the resist layer; and
    forming a protective metal layer by depositing a metal material which protects the ohmic electrode layer on a face side of the ohmic electrode layer after the ohmic electrode layer is formed,
    wherein in the etching of the insulating layer, side walls of the ohmic electrode layer are etched, the protective metal layer is not etched, and the heating is performed at a temperature not lower than a melting point of the protective metal layer.

2. The method of a semiconductor device according to claim 1, wherein the etching is wet etching which uses an etching solution, and
    wherein an etching rate of the etching solution for the protective metal layer is lower than an etching rate of the etching solution for the insulating layer and lower than an etching rate of the etching solution for the ohmic electrode layer.

3. The method of a semiconductor device according to claim 2, further comprising forming a carbon adsorbing metal layer by depositing a metal material which adsorbs carbon on a surface of the ohmic electrode layer between the forming the ohmic electrode layer and the forming the protective metal layer.

* * * * *